United States Patent
Yasuda et al.

(10) Patent No.: US 7,394,068 B2
(45) Date of Patent: Jul. 1, 2008

(54) MASK INSPECTION APPARATUS, MASK INSPECTION METHOD, AND ELECTRON BEAM EXPOSURE SYSTEM

(75) Inventors: Hiroshi Yasuda, Tokyo (JP); Takeshi Haraguchi, Tokyo (JP)

(73) Assignee: Advantest Corp., Tokyo (JP)

( * ) Notice: Subject to any disclaimer, the term of this patent is extended or adjusted under 35 U.S.C. 154(b) by 520 days.

(21) Appl. No.: 11/235,727

(22) Filed: Sep. 26, 2005

(65) Prior Publication Data

US 2006/0076491 A1    Apr. 13, 2006

(30) Foreign Application Priority Data

Sep. 27, 2004    (JP) .............................. 2004-279675

(51) Int. Cl.
*H01L 21/66* (2006.01)

(52) U.S. Cl. .................. 250/310; 250/306; 250/307

(58) Field of Classification Search .................. 250/310, 250/306, 307
See application file for complete search history.

(56) References Cited

U.S. PATENT DOCUMENTS 6,603,120 B2 *    8/2003    Yamashita ................... 250/307

FOREIGN PATENT DOCUMENTS

JP    2001-227932    8/2001

* cited by examiner

*Primary Examiner*—Kiet T Nguyen
(74) *Attorney, Agent, or Firm*—Muramatsu & Associates

(57) ABSTRACT

A mask inspection apparatus includes: an electron gun for generating an electron beam; an exposure mask for shaping the electron beam into a predetermined cross-sectional shape; means for scanning the electron beam shaped by the exposure mask; means for selecting and transmitting part of the shaped electron beam, which selecting means includes a thin film having a small transmission aperture transmitting the electron beam scanned by the scanning means and includes a thick substrate having an opening larger than the small transmission aperture and a thickness greater than that of the thin film; and means for detecting the electron beam passed through the selecting means and outputting a current signal. The detecting means includes: a reflective body for reflecting the electron beam selected by the selecting means; and a detector for detecting the electron beam reflected by the reflective body.

6 Claims, 5 Drawing Sheets

MASK INSPECTION APPARATUS, MASK INSPECTION METHOD, AND ELECTRON BEAM EXPOSURE SYSTEM

CROSS-REFERENCE TO RELATED APPLICATIONS

This application is based on and claims priority of Japanese Patent Application No. 2004-279675, filed on Sep. 27, 2004, the entire contents of which are being incorporated herein by reference.

BACKGROUND OF THE INVENTION

1. Field of the Invention

The present invention relates to a mask inspection apparatus, a mask inspection method, and an electron beam exposure system, which inspect an electron beam exposure mask.

2. Description of the Prior Art

In lithography processes for semiconductor integrated circuits and the like, patterns formed on masks are exposed to light and transferred onto wafers. If a mask has a defect, the shape and the like of a pattern transferred onto a wafer becomes abnormal. Accordingly, the mask needs to be inspected.

Heretofore, a pattern of an exposure mask has been inspected by making a comparison with a predetermined reference image using an optical microscope or making a comparison between actual image data on the mask pattern observed using an SEM or the like and a predetermined reference image.

Further, Japanese Unexamined Patent Publication No. 2001-227932 discloses a technique for performing an inspection by applying a converged electron beam to a mask, converting the electron beam passed through the mask into light, and converting an optical image obtained by conversion to light into an image signal using a CCD camera to obtain an image of the mask.

Incidentally, in the case where an exposure mask is inspected using a microscope or the like, the exposure mask is detached from an electron beam exposure system, set on the microscope or the like, and then inspected. Accordingly, an inspection process takes a long time, and there is a risk of damaging the mask when the mask is detached or mounted or a risk of allowing dusts and the like to adhere to the mask.

Moreover, the method disclosed in Japanese Unexamined Patent Publication No. 2001-227932, a mask is inspected using a dedicated mask inspection apparatus. The mask cannot be inspected in the state where the mask is attached to an electron beam exposure system. Thus, there are similar problems such as damage to the mask and the contamination of the mask.

SUMMARY OF THE INVENTION

The present invention has been accomplished in order to solve the above-described problems. An object of the present invention is to provide a mask inspection apparatus for an electron beam exposure, a mask inspection method, and an electron beam exposure system, which can perform a defect inspection of a pattern of an exposure mask with high precision using an exposure system actually used.

The above-described object is achieved by a mask inspection apparatus including: an electron gun for generating an electron beam; an exposure mask for shaping the electron beam into a predetermined cross-sectional shape; means for scanning the electron beam shaped by the exposure mask; means for selecting and transmitting part of the shaped electron beam, which selecting means includes a thin film having a small transmission aperture transmitting the electron beam scanned by the scanning means and includes a thick substrate having an opening larger than the small transmission aperture and a thickness greater than that of the thin film; and means for detecting the electron beam passed through the selecting means and outputting a current signal.

Here, the detecting means includes: a reflective body for reflecting the electron beam selected by the selecting means; and a detector for detecting the electron beam. The reflective body is made of any one of metal and a semiconductor. The detector is a PIN diode.

Further, the aforementioned object is achieved by an electron beam exposure system including the above-described mask inspection apparatus.

Moreover, the aforementioned object is achieved by a mask inspection method including: shaping an electron beam into a predetermined cross-sectional shape using an exposure mask to be inspected; scanning the electron beam shaped by the exposure mask; selecting part of the electron beam using a thin film and a thick substrate to pass the part of the electron beam through the thin film and the thick substrate, and obtaining a first signal waveform corresponding to a pattern of the exposure mask, which thin film has a small transmission aperture transmitting the electron beam, which thick substrate has an opening larger than the small transmission aperture and a thickness greater than that of the thin film; comparing the first signal waveform with a second signal waveform corresponding to a nondefective pattern of the exposure mask; and inspecting the exposure mask for a defect based on a result of the comparison.

In the present invention, an exposure mask is inspected in the state where the exposure mask is mounted on an electron beam exposure system and where an electron beam exposure is actually performed. Thus, the mask can be prevented from being damaged and dusts can be prevented from adhering to the mask during the time that the mask is being detached or mounted for an inspection.

Further, a transmissive electron beam detector 160 used in the present invention has a constitution in which the only electron beam EB passed through a small transmission aperture 27 of an electron beam transmission unit 21 is detected by an electron beam detection unit 22. This improves an S/N ratio in the detection of an electron beam and makes it possible to more accurately inspect a mask.

DESCRIPTION OF THE PREFERRED EMBODIMENTS

Hereinafter, an embodiment of the present invention will be described with reference to drawings.

(Constitution of Electron Beam Exposure System)

Figure 1:
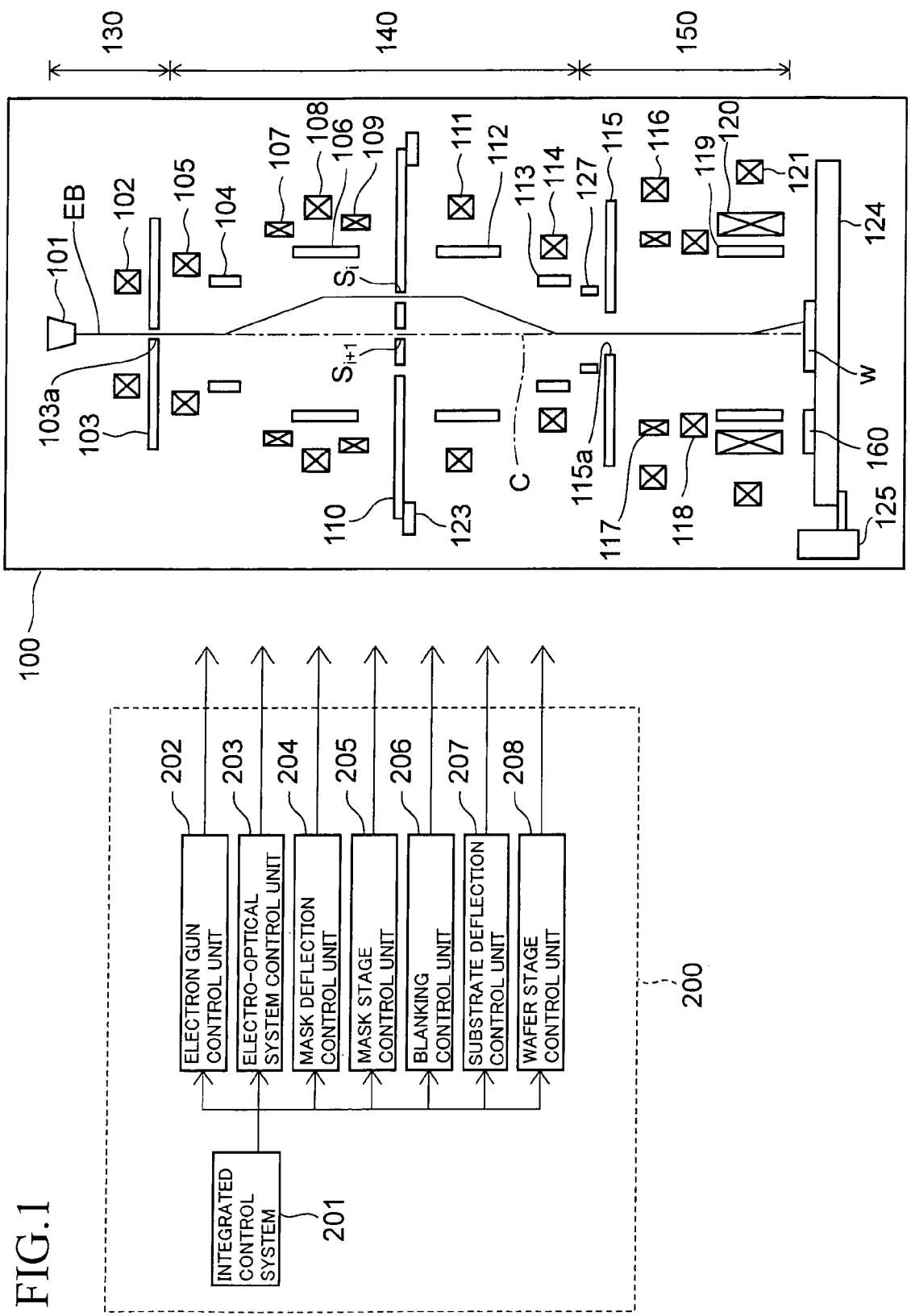
FIG. 1 is a diagram of the constitution of an electron beam exposure system used in an embodiment of the present invention.

FIG. 1 is a diagram of the constitution of an electron beam exposure system according to this embodiment.

This electron beam exposure system is broadly divided into an electro-optical system column 100 and a control unit 200 which controls each unit of the electro-optical system column 100. Of these, the electro-optical system column 100 includes an electron beam generation unit 130, a mask deflection unit 140, and a substrate deflection unit 150, and the inside of the electro-optical system column 100 is decompressed.

In the electron beam generation unit 130, an electron beam EB generated in an electron gun 101 is converged in a first electromagnetic lens 102, and then passes through a rectangular aperture 103a of a beam-shaping mask 103, whereby the cross section of the electron beam EB is shaped into a rectangular shape.

After that, an image of the electron beam EB is formed onto an exposure mask 110 by a second electromagnetic lens 105 of the mask deflection unit 140. Then, the electron beam EB is deflected by first and second electrostatic deflectors 104 and 106 to a specific pattern S formed in the exposure mask 110, and the cross-sectional shape thereof is shaped into the shape of the pattern S.

Incidentally, though the exposure mask 110 is fixed to a mask stage 123, the mask stage 123 can be moved in a horizontal plane. In the case where a pattern S is used which lies over a region exceeding the deflection range (beam deflection region) of the first and second electrostatic deflectors 104 and 106, the pattern S is moved to the inside of the beam deflection region by moving the mask stage 123.

Third and fourth electromagnetic lenses 108 and 111, which are respectively placed over and under the exposure mask 110, have the role of forming an image of the electron beam EB onto a substrate W by adjusting the amounts of currents flowing therethrough.

The electron beam EB passed through the exposure mask 110 is returned to an optical axis C by the deflection functions of the third and fourth electrostatic deflectors 112 and 113, and then the size of the electron beam EB is reduced by a fifth electromagnetic lens 114.

In the mask deflection unit 140, first and second correction coils 107 and 109 are provided. These correction coils 107 and 109 correct beam deflection errors generated in the first to fourth electrostatic deflectors 104, 106, 112, and 113.

After that, the electron beam EB passes through an aperture 115a of a shield plate 115 partially constituting the substrate deflection unit 150, and projected onto the substrate W by first and second projection electromagnetic lenses 116 and 121. Thus, an image of the pattern of the exposure mask 110 is transferred onto the substrate W at a predetermined reduction ratio, e.g., a reduction ratio of 1/60.

In the substrate deflection unit 150, a fifth electrostatic deflector 119 and an electromagnetic deflector 120 are provided. The electron beam EB is deflected by these deflectors 119 and 120. Thus, an image of the pattern of the exposure mask is projected onto a predetermined position on the substrate W.

Furthermore, in the substrate deflection unit 150, provided are third and fourth correction coils 117 and 118 for correcting deflection errors of the electron beam EB on the substrate W.

The substrate W is fixed to a wafer stage 124 which can be moved in horizontal directions by a driving unit 125 such as a motor. The entire surface of the substrate W can be exposed to light by moving the wafer stage 124.

Moreover, a transmissive electron beam detection device 160 is placed on the wafer stage 124. This allows the electron beam exposure system to function as a mask inspection apparatus, and makes it possible to inspect whether there is a defect in the pattern of the exposure mask.

(Explanation for Control Unit)

On the other hand, the control unit 200 has an electron gun control unit 202, an electro-optical system control unit 203, a mask deflection control unit 204, a mask stage control unit 205, a blanking control unit 206, a substrate deflection control unit 207, and a wafer stage control unit 208. Of these, the electron gun control unit 202 controls the electron gun 101, and controls the acceleration voltage of the electron beam EB, beam radiation conditions, and the like. Further, the electro-optical system control unit 203 controls the amounts of currents flowing and the like into the electromagnetic lenses 102, 105, 108, 111, 114, 116, and 121, and adjusts the magnification, focal point, and the like of the electro-optical system constituted by these electromagnetic lenses. The blanking control unit 206 deflects the electron beam EB generated before the start of an exposure onto the shield plate 115 by controlling the voltage applied to a blanking electrode 127, thus preventing the electron beam EB from being applied to the substrate W before an exposure.

The substrate deflection control unit 207 controls the voltage applied to the fifth electrostatic deflector 119 and the amount of a current flowing into the electromagnetic deflector 120 so that the electron beam EB is deflected onto a predetermined position on the substrate W. The wafer stage control unit 208 moves the substrate W in horizontal directions by adjusting the driving amount of the driving unit 125 so that the electron beam EB is applied to a desired position on the substrate W. The above-described units 202 to 208 are integrally controlled by an integrated control system 201 such as a workstation.

(Explanation for Transmissive Electron Beam Detection Device)

Figure 2:
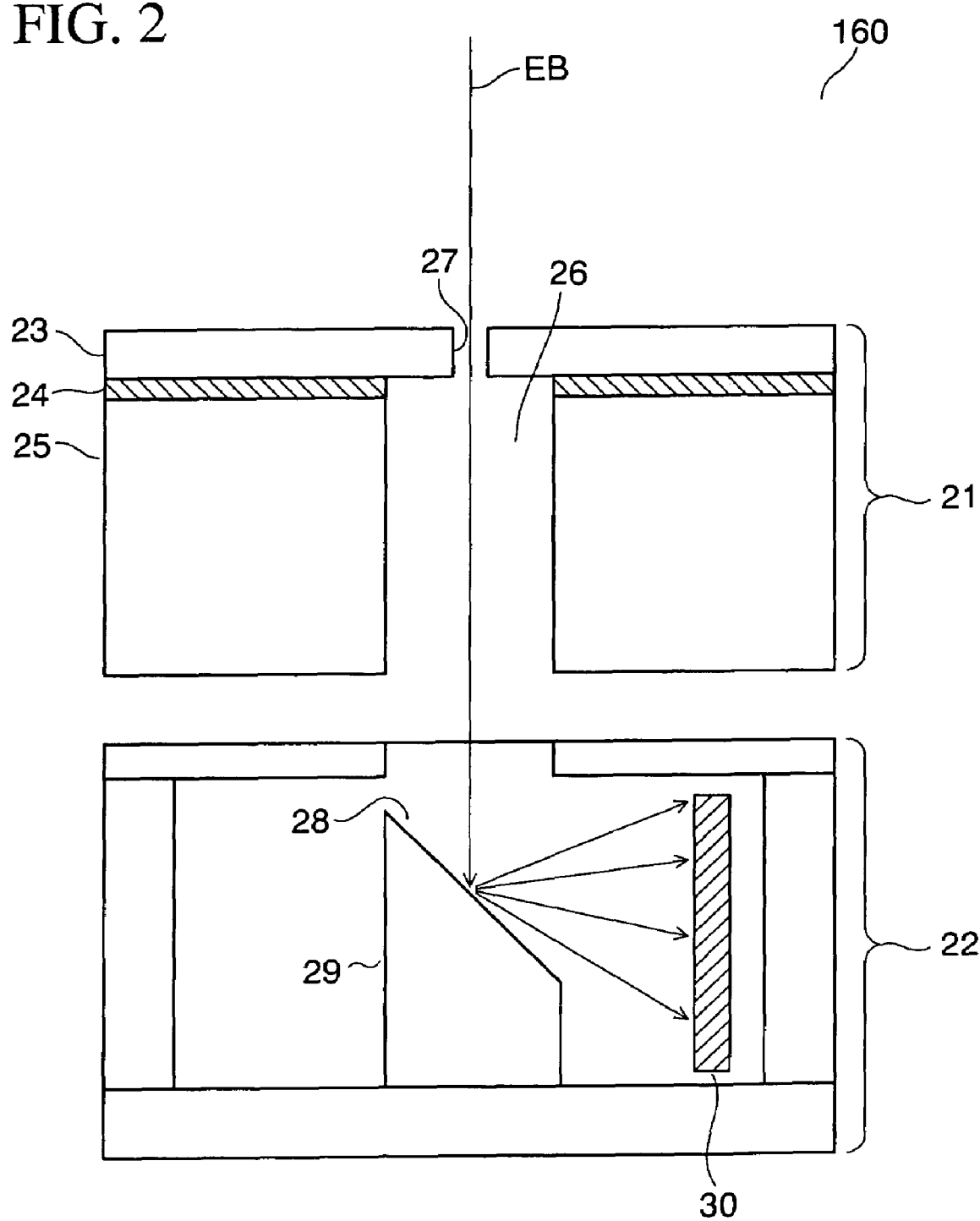
FIG. 2 is a diagram of the constitution of a transmissive electron beam detection device used in the embodiment of the present invention.

FIG. 2 is a diagram showing the constitution of a transmissive electron beam detection device 160 used in this embodiment. This transmissive electron beam detection device 160 includes an electron beam transmission unit 21 which transmits only the electron beam EB passed through a small transmission aperture 27 formed in a thin film 23 made of silicon and which is configured not to transmit an electron beam scattered by the thin film 23 made of silicon, and an electron beam detection unit 22 which detects the electron beam EB passed through the electron beam transmission unit 21.

As the electron beam transmission unit 21, used is a silicon-on-insulator (SOI) substrate including a substrate 25 made of a silicon single crystal, a buried oxide layer 24, and a thin film 23 made of silicon. In this embodiment, the thickness of the thin film 23 made of silicon is approximately 2 μm. Further, the thickness of the buried oxide layer 24 ($SiO_2$) is approximately 1 μm, and that of the substrate 25 made of a silicon single crystal is approximately 500 μm. Thus, the substrate 25 is formed to have a thickness greater than that of the thin film 23 made of silicon. Incidentally, the thickness of the thin film 23 made of silicon is preferably 1 μm to 10 μm, and that of the buried oxide layer 24 is preferably 0.1 μm to 4 μm. Further, the thickness of the substrate 25 is preferably 100 μm to 1000 μm.

In the substrate 25 made of a silicon single crystal, an opening 26 having a diameter of 10 μm is formed. Further, in this embodiment, in the thin film 23 made of silicon, the small transmission aperture 27 having a diameter of 50 nm is formed with the center thereof at the center of the opening 26 provided in the substrate 25 made of a silicon single crystal.

Incidentally, the diameter of the opening 26 is preferably 1 µm to 100 µm, and that of the small transmission aperture 27 is preferably 10 nm to 500 nm.

By forming the electron beam transmission unit 21 as described above, the electron beam EB scattered by the thin film 23 cannot pass through the opening 26 of 10 µm under the thin film 23, and is absorbed by the silicon of the substrate 25. Accordingly, the electron beam EB scattered by the thin film 23 cannot pass through the substrate 25, but only the electron beam EB passed through the small transmission aperture 27 formed in the thin film 23 can pass through the substrate 25.

The electron beam detection unit 22 includes a reflective body 28 made of a metal which reflects the electron beam EB passed through the electron beam transmission unit 21 in lateral directions, and a detection unit 30 which detects the electron beam EB. In this embodiment, a PIN diode is used as the detection unit 30 (detector). The reflective body 28 may be made of metal or a semiconductor. Alternatively, the reflective body 28 may be one in which gold or the like is plated on a portion of a base 29 from which the electron beam EB is reflected.

Incidentally, in this embodiment, the electron beam EB is not applied directly to the detection unit 30, but is applied to the detection unit 30 after having been reflected from the reflective body 28. This is because the life of the PIN diode is shortened if the electron beam EB is applied directly to the PIN diode. In practice, if the electron beam EB continues to be applied to one position on the PIN diode, the life of the PIN diode is shortened to several tens of hours. However, the inventors have confirmed that if the PIN diode receives the electron beam EB after the electron beam EB has been reflected from the reflective body 28, the life of the PIN diode is prolonged compared to that for the case where the PIN diode directly receives the electron beam EB.

As described above, only the electron beam EB passed through the electron beam transmission unit 21 is detected by the detection unit 30 of the electron beam detection unit 22. Accordingly, an unnecessary electron beam is not detected, and an S/N ratio is improved. This makes it possible to inspect a mask pattern with high precision.

Further, since the electron beam is applied to the PIN diode after having been reflected from metal, the life of the PIN diode is prolonged compared to that for the case where the PIN diode directly receives the electron beam.

(Method of Inspecting Exposure Mask)

Figure 3:
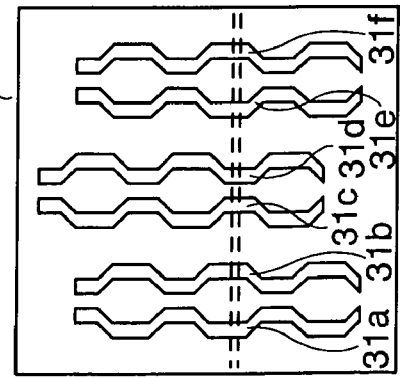
FIG. 3 is an explanatory diagram showing an overview of a method of inspecting an exposure mask.
Figure 3:
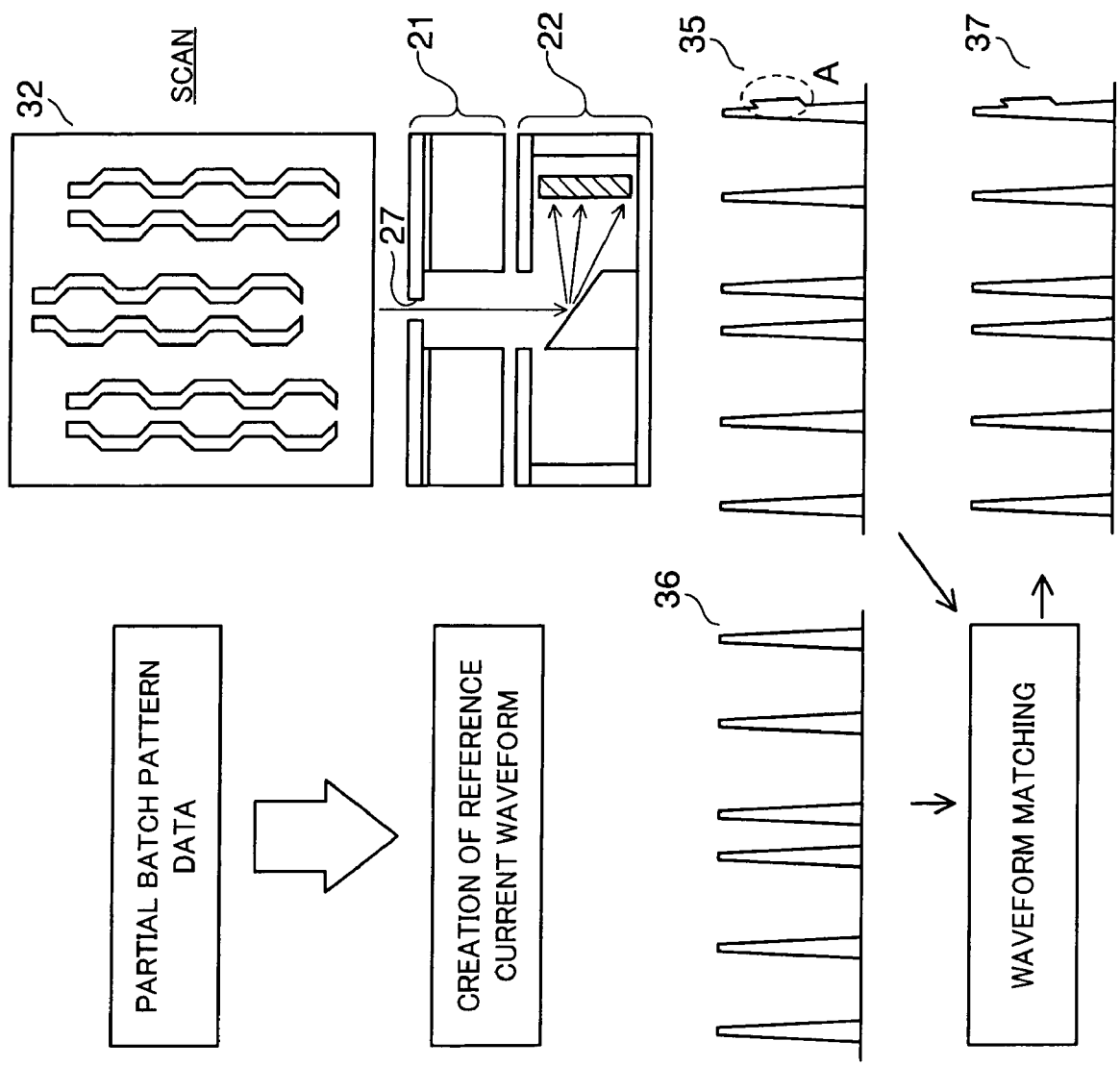

FIG. 3 is a diagram for explaining an overview of a method of inspecting an exposure mask using the transmissive electron beam detection device 160. Here, an exposure mask pattern (partial batch pattern) 31 shown in FIG. 3 is inspected.

First, an exposure mask is mounted on the mask stage of the electron beam exposure system and irradiated with an electron beam. The electron beam EB passed through the exposure mask is deflected by the fifth electrostatic deflector 119 and the electromagnetic deflector 120 of the substrate deflection unit 150. Thus, an image of a pattern 32 of the exposure mask is projected onto a predetermined position on the transmissive electron beam detection device 160. The electron beam EB passed through the exposure mask is scanned using these deflectors, and the electron beam is detected by the electron beam detector 22 of the transmissive electron beam detection device 160 placed on the wafer stage. For the detection of the electron beam, electrons passed through the small transmission aperture 27 are received by the PIN diode, and a current waveform 35 generated in the PIN diode is obtained.

Next, a comparison is made between the current waveform 35 (first signal waveform) obtained in the transmissive electron beam detection device 160 and a reference current waveform 36 (second signal waveform). Here, the reference current waveform is an ideal waveform which is expected to be obtained for a nondefective pattern. For example, a reference current waveform corresponding to a portion indicated by dotted lines in the exposure mask pattern 31 becomes like the waveform 36 because currents are generated in portions 31a to 31f where the exposure pattern and the lines indicated by the dotted lines intersect.

As can be seen from the current waveform 35, there is a portion A in which the current waveform 35 is different from the reference current waveform 36. Accordingly, it is revealed that the exposure mask 31 has a defect. Further, a waveform 37 can be obtained by performing waveform matching between the reference current waveform 36 and the actual current waveform 35, whereby a defect occurrence position is clarified.

Figure 4:
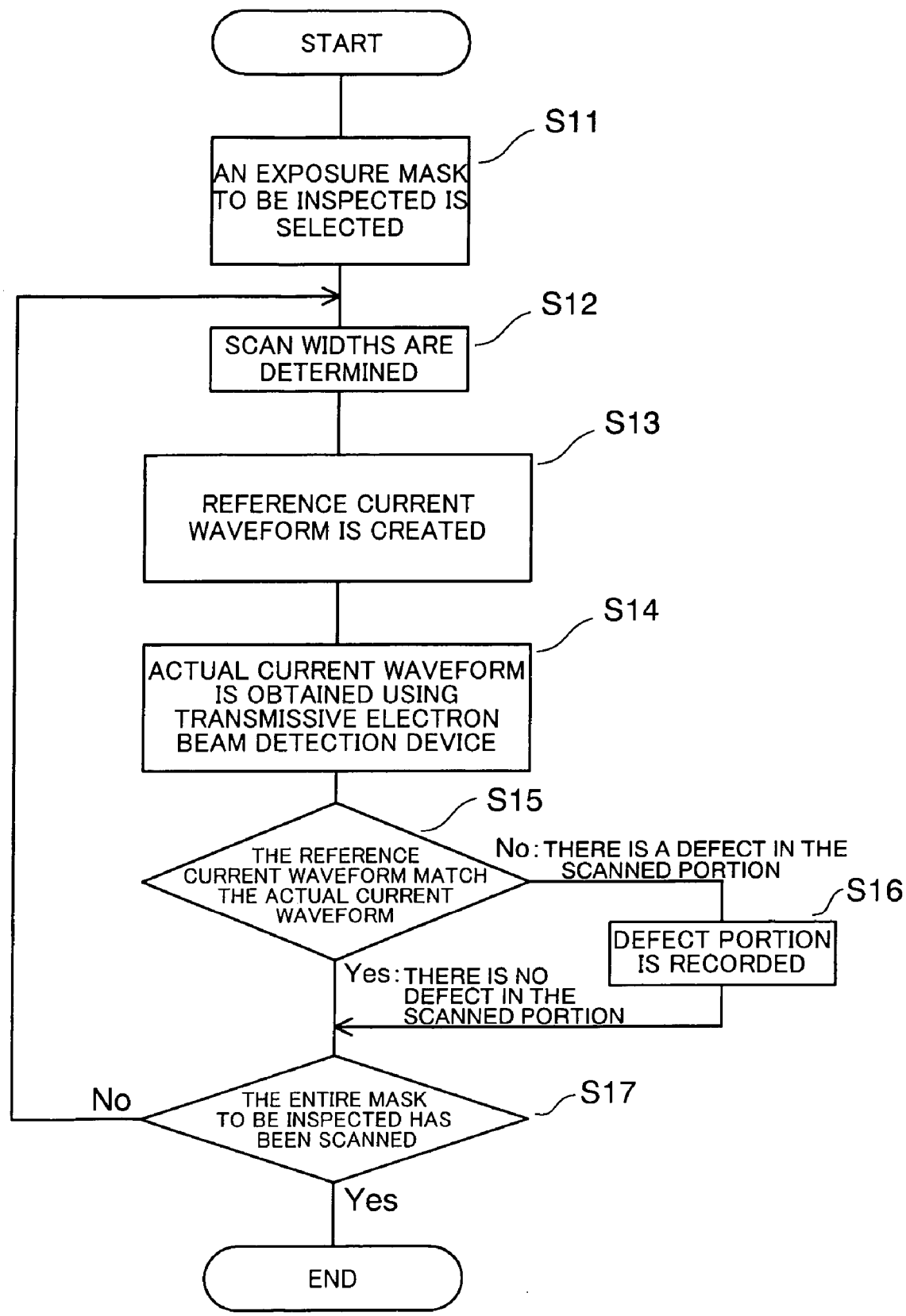
FIG. 4 is a flowchart showing a procedure of the method of inspecting an exposure mask.

FIG. 4 is a flowchart in which a procedure for inspecting an exposure mask is summarized.

First, in step S11, an exposure mask to be inspected is selected.

Next, in step S12, scan widths in the X and Y directions of the exposure mask are determined.

Next, in step S13, a scanned portion of the exposure mask to be inspected is extracted, and a reference current waveform is created.

Next, in step S14, the electron beam exposure system is actually operated, and an electron beam passed through the exposure mask is deflected by the substrate deflection unit to scan the electron beam. Further, a current waveform is obtained which is generated by electrons obtained by detecting the scanned electron beam using the transmissive electron beam detection device 160.

Next, in step S15, a comparison is made between the reference current waveform found in step S13 and the actual current waveform obtained in step S14. If the waveforms match with each other, there is no defect in the scanned portion of the exposure mask inspected. Then, the process goes to step S17.

In step S17, a determination is made as to whether the entire mask to be inspected has been scanned or not. If the entire mask has not been scanned, the process goes back to step S12. Then, the scanned portion is shifted in the Y direction, and the same process is performed.

On the other hand, if the current waveforms do not match with each other in step S15, a determination is made that there is a defect in the scanned portion of the exposure mask. In this case, a portion determined to have a defect in step S16 is recorded in a storage device or the like. Then, the process goes to step S17.

The above-describe process is performed until the scanning of the entire exposure mask to be inspected is completed.

Figure 5:
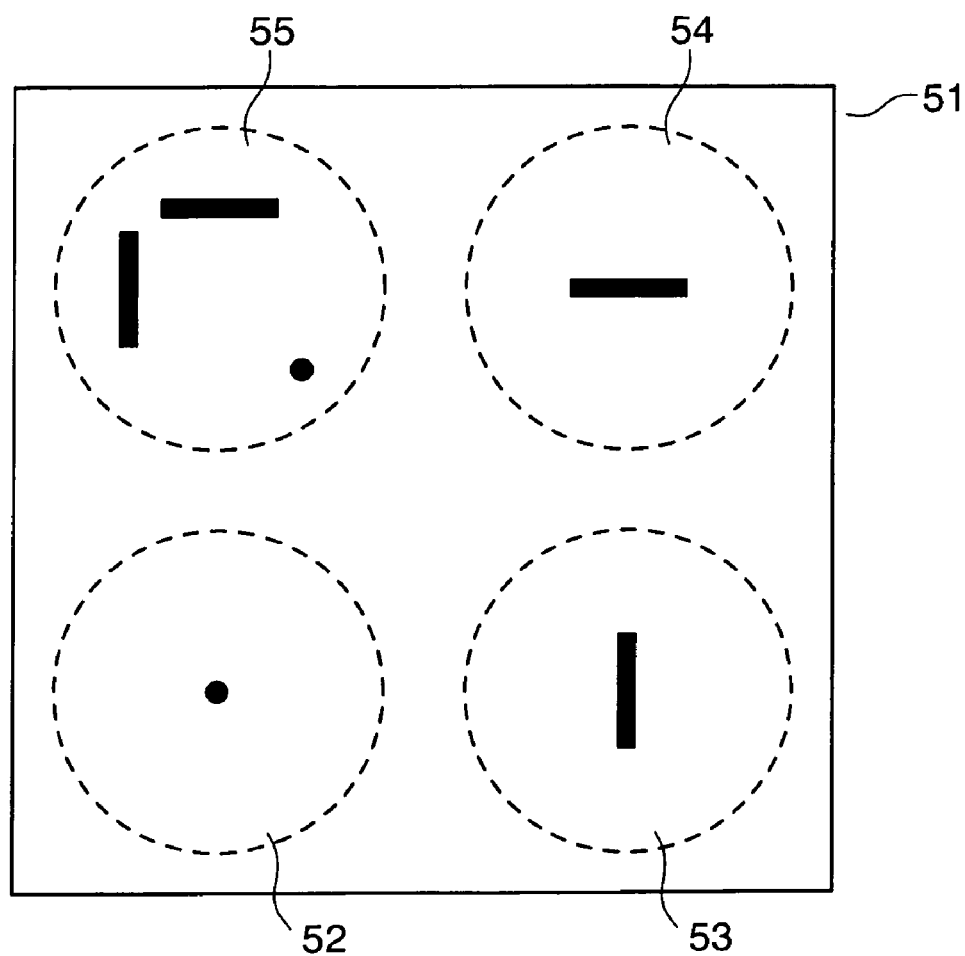
FIG. 5 is a plan view showing small transmission apertures of the electron beam detection device.
Figure 5:
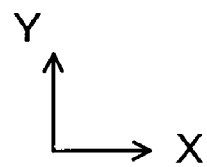

Incidentally, in this embodiment, as shown in FIG. 5, a dot 52, a vertical line 53 (line which is long in the Y direction), and a horizontal line 54 (line which is long in the X direction) are prepared as shapes of the small transmission aperture 27 of the transmissive electron beam detection device 160. Further, a shape 55 is also prepared which is formed by combining the dot 52 and the vertical and horizontal lines 53 and 54.

Moreover, the four types of small transmission apertures 27 shown in FIG. 5 are formed in an area 51, and various sizes of transmission apertures are prepared for each area 51. For example, dots are prepared which have diameters of 100 nm, 120 nm, 140 nm, 160 nm, 180 nm, and 200 nm. Further, vertical and horizontal lines are prepared which have long sides of 7 µm and have short sides of 40 nm, 50 nm, 60 nm, 80 nm, 100 nm, and 300 nm. Thus, a width in which the electron beam is scanned can be appropriately determined depending on what is selected as the shape of the small transmission aperture 27. For example, in the case where a vertical line 53 which is long in the Y direction is selected, a scan can be performed in a shorter time by setting a scan width in the Y direction to the length of the vertical line. Further, in the case where the shape of a pattern cannot be accurately detected only using the vertical line 53 depending on the shape of the pattern, the electron beam EB can be scanned by selecting not only the vertical line 53 but also a dot 52. Thus, the mask to be inspected can be accurately scanned without excess or deficiency.

As described above, in this embodiment, an exposure mask is inspected in the state where the exposure mask is mounted on the electron beam exposure system and where an electron beam exposure is actually performed. Thus, the mask can be prevented from being damaged and dusts can be prevented from adhering to the mask during the time that the mask is being detached or mounted for an inspection.

Moreover, the transmissive electron beam detector 160 used in this embodiment has a constitution in which the only electron beam EB passed through the small transmission aperture 27 of the electron beam transmission unit 21 is detected by the electron beam detection unit 22. This improves an S/N ratio in the detection of an electron beam and makes it possible to more accurately inspect a mask.

What is claimed is:

1. A mask inspection apparatus comprising:
    an electron gun for generating an electron beam;
    an exposure mask for shaping the electron beam into a predetermined cross-sectional shape;
    means for scanning the electron beam shaped by the exposure mask;
    means for selecting and transmitting part of the shaped electron beam, the selecting means comprising a thin film and a thick substrate, the thin film having a small transmission aperture transmitting the electron beam scanned by the scanning means, the thick substrate having an opening larger than the small transmission aperture and a thickness greater than that of the thin film; and
    means for detecting the electron beam passed through the selecting means and outputting a current signal.

2. The mask inspection apparatus according to claim 1, wherein the detecting means comprises:
    a reflective body for reflecting the electron beam selected by the selecting means; and
    a detector for detecting the electron beam reflected by the reflective body.

3. The mask inspection apparatus according to claim 2, wherein the reflective body is made of any one of metal and a semiconductor.

4. The mask inspection apparatus according to claim 2, wherein the detector is a PIN diode.

5. A method of inspecting a mask, comprising:
    shaping an electron beam into a predetermined cross-sectional shape using an exposure mask to be inspected;
    scanning the electron beam shaped by the exposure mask;
    selecting part of the electron beam using a thin film and a thick substrate to pass the part of the electron beam through the thin film and the thick substrate, and obtaining a first signal waveform corresponding to a pattern of the exposure mask, the thin film having a small transmission aperture transmitting the electron beam, the thick substrate having an opening larger than the small transmission aperture and a thickness greater than that of the thin film;
    comparing the first signal waveform with a second signal waveform corresponding to a nondefective pattern of the exposure mask; and
    inspecting the exposure mask for a defect based on a result of the comparison.

6. An electron beam exposure system which also functions as the mask inspection apparatus according to claim 1.

* * * * *